(12) United States Patent
Onishi et al.

(10) Patent No.: US 7,244,625 B2
(45) Date of Patent: Jul. 17, 2007

(54) PLASMA PROCESSING METHOD AND PLASMA PROCESSING DEVICE

(75) Inventors: Katsuhiko Onishi, Jyouetsu (JP); Yoji Bito, Toyama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/060,316

(22) Filed: Feb. 18, 2005

(65) Prior Publication Data
US 2005/0194354 A1    Sep. 8, 2005

(30) Foreign Application Priority Data
Feb. 20, 2004  (JP) .............................. 2004-043744

(51) Int. Cl.
*H01L 21/66* (2006.01)
*H01L 21/302* (2006.01)

(52) U.S. Cl. .................... 438/14; 438/16; 438/706; 156/345.1

(58) Field of Classification Search ................. 438/14, 438/16, 706; 156/345.1
See application file for complete search history.

(56) References Cited

U.S. PATENT DOCUMENTS 6,607,986 B2 * 8/2003 Seta et al. ................. 438/710

2003/0192856 A1 * 10/2003 Balasubramaniam et al. . 216/56

FOREIGN PATENT DOCUMENTS

| JP | 02-130824 | 5/1990 |
|----|-----------|--------|
| JP | 08-186099 | 7/1996 |
| JP | 10-50663  | 2/1998 |
| JP | 2000-12521 | 1/2000 |

OTHER PUBLICATIONS

Chaio et al., Photoresist removal method capable of reducing photoresist residue and inhibiting damage to the insulation layer and giving good etch profile, Mar. 11, 2002, 3 pages.*

* cited by examiner

*Primary Examiner*—Nadine Norton
*Assistant Examiner*—Lynette T. Umez-Eronini
(74) *Attorney, Agent, or Firm*—Steptoe & Johnson LLP

(57) ABSTRACT

When plasma ashing is performed on a resist on a wafer, deposit gas containing at least one type of deposit component to be generated from a resist by ashing is added to a gas for plasma generation supplied from a gas supply system for plasma generation, by a deposit gas supply system. By this, the deposit component is actively deposited on the inner surface of a wafer processing chamber so as to protect the inner face of the wafer processing chamber from plasma. As a result, damage of the wafer processing chamber during ashing and particle generation due to the damage are prevented.

4 Claims, 7 Drawing Sheets

F I G. 1
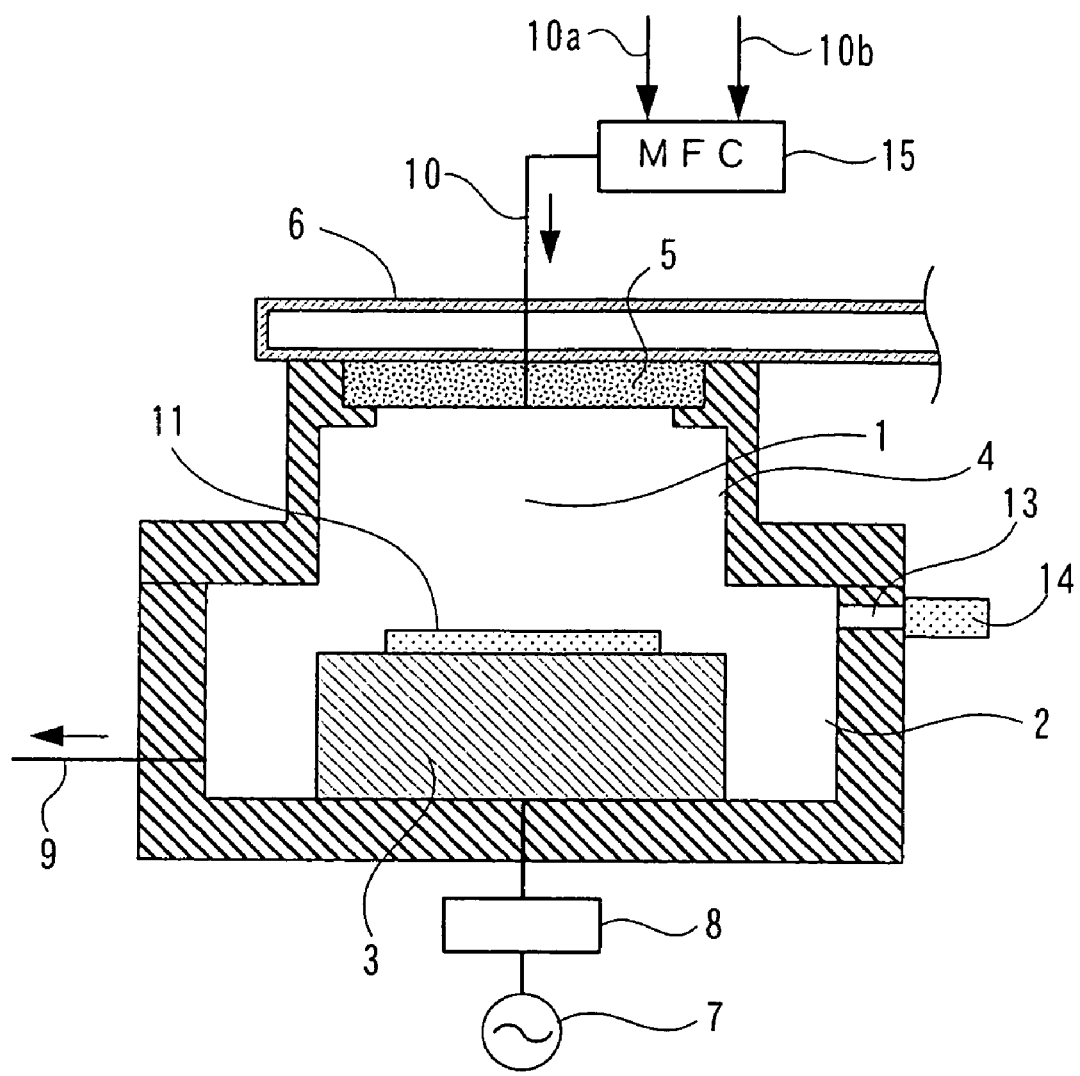

F I G. 3A
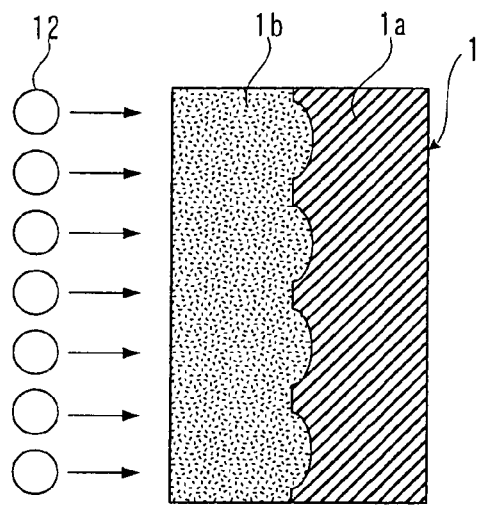
F I G. 3B
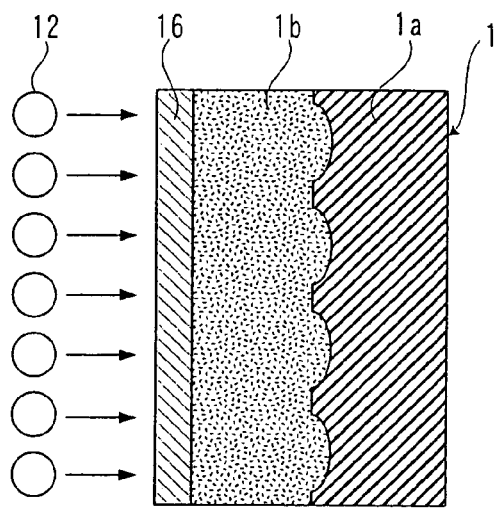

ASHING AMOUNT C
$c(0) = 0$
$c(t+\Delta t) = c(t) + \int_{t}^{t+\Delta t} f2(x) \Delta t$

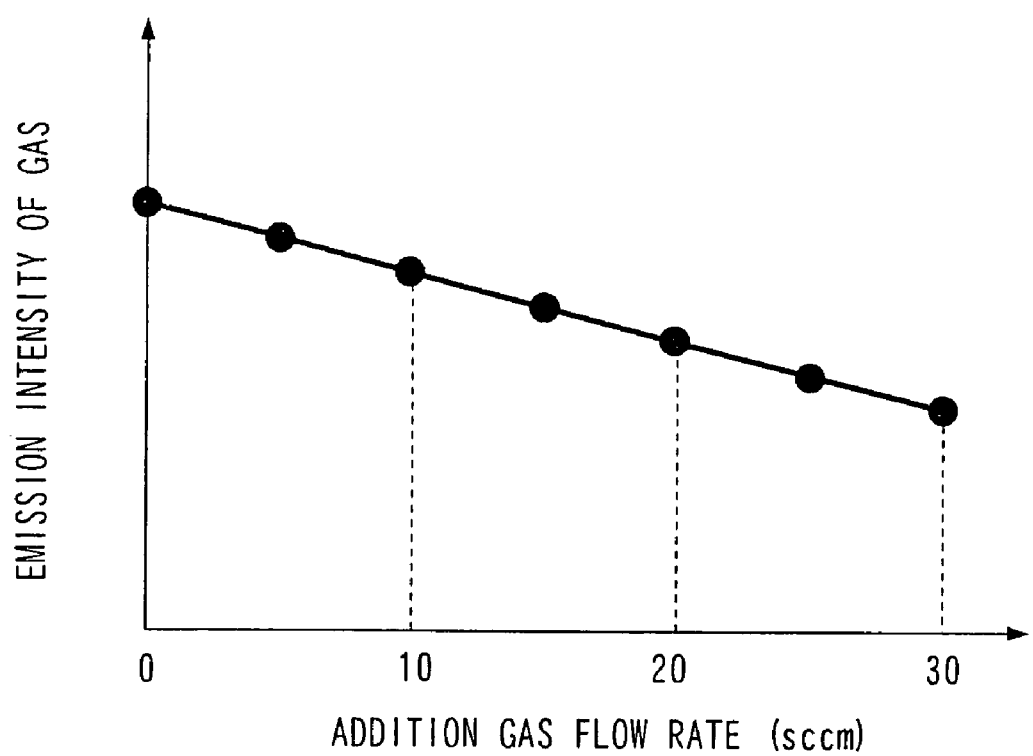
F I G. 6

PLASMA PROCESSING METHOD AND PLASMA PROCESSING DEVICE

BACKGROUND OF THE INVENTION

1. Field of the Invention

The present invention relates to a plasma processing method and plasma processing device for fabricating semiconductor devices, and more particularly to a plasma processing method and plasma processing device for ashing in a preprocess of wafer processing.

2. Description of the Related Art

Currently such a technology as ESC (Electro-Static Chack) is being used for ashing, which tends to jump up equipment cost. And since high throughput is demanded, a 2000 W or higher microwave is sometimes used to increase the ashing speed. Also Cu is more frequently used for the wiring of semiconductor devices, and decreasing the temperature of ashing is demanded more to prevent the oxidation of Cu. For example, conventionally ashing is performed in a 200° C. or higher stage temperature area, but now it is required to be performed in a 100° C. or less temperature area to use Cu. In a low temperature area, the ashing speed tends to drop, so the power of the microwave must be increased to increase the ashing speed.

Generally in a plasma processing device, which performs the etching and ashing (hereafter simply called ashing), the inner face of the wafer processing chamber is damaged by being exposed to plasma, and particles are generated. In some recent cases ashing is performed with adding fluorine gas to $O_2$ plasma (e.g. see Japanese Patent Application Laid-Open No. 2000-12521) where the wafer processing chamber is easily damaged. Therefore it is proposed to use alumite for parts of the chamber so as to prevent the generation of particles (e.g. see Japanese Patent Application Laid-Open No. H10-50663).

However even if the inner face of the wafer processing chamber are coated with alumite, the alumite coating itself is damaged by being continuously exposed to plasma, where aluminum on the under-layer is exposed to plasma, and particles are generated. O radicals in the plasma collide with the alumite coating and causes cracks, opens generated cracks and causes the stripping of the exposed aluminum under-layer and the alumite coating.

If ashing is performed by adding fluorine gas to $O_2$ plasma, the damage of alumite coating tends to progress even more easily. In the case of a wafer processing chamber that is used in a high microwave area, the energy of the O radicals increases and damage increases particularly in a high plasma density area. Also in the case of a surface wave plasma type wafer processing chamber, the plasma density increases and damage increases in the upper area of the chamber.

The resist on the wafer, for which ashing is performed, is comprised of such elements as carbon (C) and hydrogen (H), so during ashing the deposit components such as C and H are supplied from the resist to the plasma, and are deposited onto the inner face of the wafer processing chamber to protect it from plasma. However when the resist decreases as ashing progresses, the supply of the deposit components to the plasma decreases, the deposit amount on the inner face of the wafer processing chamber decreases, the wafer processing chamber is damaged, and particles are generated.

In the fabrication of semiconductor devices, particles are one of the major obstruction factors which drop yield, so the prevention of particle generation remains a problems.

SUMMARY OF THE INVENTION

To solve the above problem, according to the plasma processing method and plasma processing device of the present invention, deposit gas containing deposit components is added to the gas for plasma generation, so that the deposit components are actively deposited onto the inner face of a wafer processing chamber, and the inner face of the wafer processing chamber is protected from plasma.

In other words, the plasma processing method of the present invention is characterized in that the deposit gas, containing at lest one type of deposit component to be generated from a resist by ashing, is added to the gas for plasma generation when plasma ashing is performed on the resist on a processing target substrate.

It is preferable that the deposit gas is added after the resist or the deposit component generated therefrom is decreased to less than a predetermined amount.

The addition amount of the deposit gas may be controlled such that the deposit component in the plasma is maintained to be a predetermined amount.

The deposit component can be monitored by measuring its emission intensity.

It may be preferable that the relationship of the ashing speed and the addition amount of the deposit gas is determined in advance, and the addition amount of the deposit gas is controlled such that the deposit component in the plasma is maintained to be a predetermined amount, as well as the ashing speed is determined from the addition amount of the deposit gas, the ashing amount is calculated from the determined ashing speed and ashing time, and the ashing is ended when this ashing amount exceeds the set value.

For the deposit gas, the gas of $C_wH_xO_yN_z$ (w, x, y, z are 0 or a positive number) may be used. Needless to say C is carbon, H hydrogen, O hydrogen and N nitrogen.

The plasma processing device of the present invention comprises: a plasma processing chamber including a plasma generation device and a gas supply system for supplying gas for plasma generation; a second gas supply system for adding deposit gas containing at least one type of deposit component to be generated from the resist to the gas for plasma generation when plasma ashing is performed on the resist on a processing target substrate; a detector for detecting the emission intensity of the deposit component generated from the resist during plasma ashing; and a control device to which the relationship between the emission intensity of the deposit component and the addition amount of the deposit gas is input in advance, for determining and controlling the addition amount of the deposit gas by the second gas supply system, according to the emission intensity detected by the detector.

It is preferable that the plasma processing device further comprises an ashing amount computing device to which the relationship between the ashing speed and the addition amount of the deposit gas is input in advance, for determining the ashing speed from the addition amount of the deposit gas by the second gas supply system, and calculating the ashing amount from the determined ashing speed and ashing time.

BRIEF DESCRIPTION OF THE DRAWINGS

FIG. 1 is a cross-sectional view depicting a general configuration of the plasma processing device according to the first embodiment of the present invention;

FIG. 3A and FIG. 3B are cross-sectional views depicting a wall portion of the plasma processing device in FIG. 1;

FIG. 6 is a graph depicting the relationship between the emission intensity of the gas under predetermined processing conditions and addition gas flow rate in the plasma processing device in FIG. 3.

DESCRIPTION OF THE PREFERRED EMBODIMENTS

First Embodiment

Figure 2A:
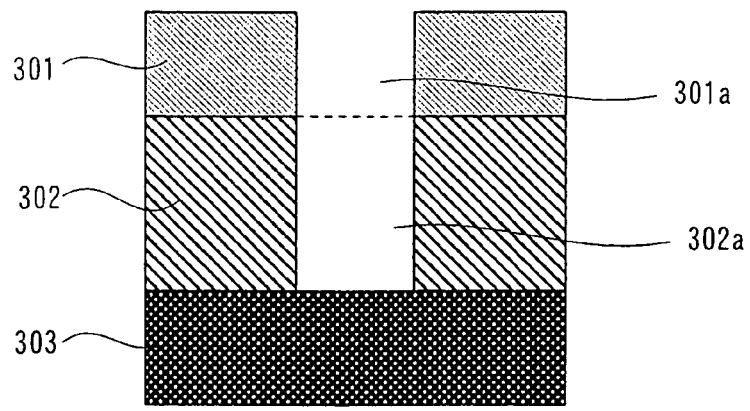
FIG. 2A, FIG. 2B and FIG. 2C are cross-sectional views depicting the status when ashing is performed on the resist on a wafer.

FIG. 1 shows a general configuration of the plasma processing device according to the first embodiment of the present invention.

In the plasma processing device shown in FIG. 1, the wafer processing chamber 1 has stages, a top and a bottom part in the cross-section in the horizontal direction, and in the bottom processing chamber 2 of which the cross-sectional area is larger, a bottom electrode 3, which also functions as a stage, is disposed, and in the top processing chamber 4, a quartz top plate 5 and a wave guide 6 for supplying microwaves are disposed. A high frequency power supply 7 and a matching box 8 which are connected to the bottom electrode 3, and an exhaust system 9 and supply system 10 which open into the wafer processing chamber 1, are also disposed. The wall portion constituting the wafer processing chamber 1 (top processing chamber 4 and bottom processing chamber 2) is made of aluminum, and alumite coating is formed on the inner face to protect the wall from plasma.

The difference of this plasma processing device from a conventional one is that the gas supply system for plasma generation 10a, deposit gas supply system 10b and mass flow controller 15 for controlling the gas flow rate of each system are disposed in the supply system 10. Another difference is that in the wafer processing chamber 1 (bottom processing chamber 2 in this case), the view port 13 which opens at a position slightly higher than the top face of the bottom electrode 3 is created to penetrate the wall portion, and the spectroscope 14 for detecting emission in the wafer processing chamber 1 via this view port 13 is disposed.

At plasma ashing, a wafer 11 on which resist is formed is disposed on the bottom electrode 3, gas is exhausted through the exhaust system 9, and while supplying $O_2$ as the gas for plasma generation (ashing gas) through the supply system 10, micro waves (2.45 GHz) are supplied via the wave guide 6, and RF power (13.56 MHz) is supplied to the bottom electrode 3 by the high frequency power supply 7, so that $O_2$ plasma is generated in the wafer processing chamber 1, and ashing is performed on the resist on the wafer 11.

At this time, deposit gas containing at least one type of deposit component to be generated from the resist (hereafter called deposit gas), CO in this case, is added to the $O_2$ and supplied to the wafer processing chamber 1 by the supply system 10. The processing conditions are, for example, as shown below. Compared with a conventional method, a part of $O_2$ is substituted with CO, but the flow rate is the same.

microwave power: 2000 W
RF power: 100 W
$O_2$: 300 sccm
CO: 30 sccm
pressure: 30 Pa
stage temperature: 30° C.

Figure 2B:
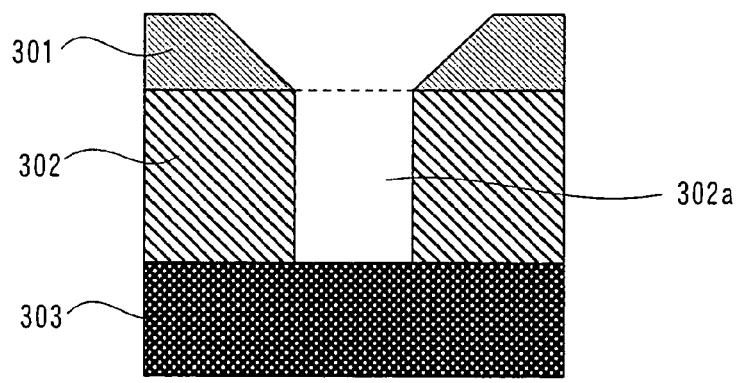
Figure 2C:
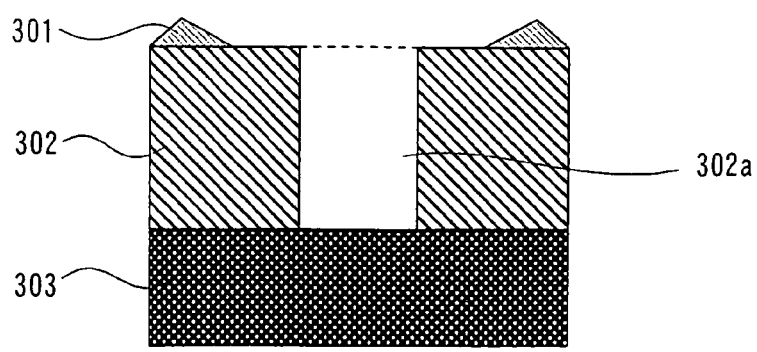

FIG. 2 shows cross-sectional views depicting the ashing of the wafer 11. As FIG. 2A shows, the resist 301 on the oxide film 302 on the surface of the semiconductor substrate 303 is in a status where the opening 301a used for forming the opening 302a on the oxide film 302 is opened at a predetermined width. As ashing advances, the thickness of the resist 301 decreases, as FIG. 2B shows, where thickness decreases more as the area becomes closer to the opening, and as FIG. 2C shows, the resist then remains as a protrusion only at a part of the top face of the oxide film 302, and is eventually completely removed.

FIG. 3 shows cross-sectional views of the wall portion of the wafer processing chamber 1 (top processing chamber 4, bottom processing chamber 2). As FIG. 3A shows, the wall portion 1a is made of aluminum, and alumite coating 1b is formed on the inner face to protect the wall portion 1a from plasma.

When ashing starts, O radicals 12 in the plasma collide with the alumite coating 1b, but as ashing is performed on the above mentioned resist 301, deposit components thereof, such as C and H, are supplied to the plasma, and are deposited on the inner face of the wall 1a, such as the side wall, of the wafer processing chamber 1 as deposit 16, as FIG. 3B shows.

As ashing progresses and the resist 301 decreases, the supply of the deposit component from the resist 301 to plasma decreases, but the deposit gas (CO) added to the ashing gas ($O_2$) supplements the decrease, and the deposit of the deposit component 16 onto the inner face of the wall portion 1a is maintained. As a result, O radicals 12 in the plasma do not directly collide with the alumite coating 1b and the aluminum wall portion 1a, and the generation of particles of the alumite coating 1b, aluminum wall material 1a and aluminum compound (e.g. aluminum oxide) is prevented.

Therefore it is necessary to give particular consideration to the under layer of the resist 301, and the present invention can be used for resist ashing with an SIO type FSG (Fluorinated Silicate Glass) and TEOS (Tetra Ethoxy Silane), which have been used for inter-layer insulation film and in insulation film called Low-k, of which use is expected to increase in the future.

For the deposit gas, any gas containing at least one type of deposit component to be supplied from the resist 301 can be used without any particular restriction, and, for example, a gas indicated by CwHxOyNz (w, x, y, z are 0 or a positive number), such as CO, $CO_2$ and $CH_4$, can be used. The deposit component to be supplied from the resist 301 must be contained in order to prevent influence on the wafer 11. C is contained in the resist 301, and O, H and N contained in the resist 301 are either exhausted as gas or are combined with C and deposited as the deposit substance, 16.

Another possible method is performing ashing with an $O_2$ single gas when ashing is started (STEP 1), and switching the single gas to a mixed gas where deposit gas is added to $O_2$, to perform ashing at the point when the deposit component amount to be supplied from the resist 301 decreases (STEP 2).

At this time, STEP 1, where an $O_2$ single gas is used, is switched to STEP 2, where deposit gas is added to $O_2$ at the timing when the supply amount of the deposit component from the resist 301 decreases, in other words, at the timing when the status in FIG. 2B transits to the status in FIG. 2C. Switching from STEP 1 to STEP 2 may be performed as the point when the supply of deposit component decreases to below a predetermined amount by monitoring the resist 301, but it is preferable to monitor the emission intensity corresponding to the deposit component (e.g. C) by a spectroscope 14, and switching at the point when the emission intensity decreases below a predetermined amount. The processing conditions are shown below.

STEP 1
 microwave power: 2000 W
 RF power: 100 W
 $O_2$: 330 sccm
 pressure: 30 Pa
 stage temperature: 30° C.

STEP 2
 microwave power: 2000 W
 RF power: 100 W
 $O_2$: 300 sccm
 CO: 30 sccm
 pressure: 30 Pa
 stage temperature: 30° C.

The second plasma processing method is for preventing a drop in the ashing speed when such deposit gas as CO is added. The deposit gas is supplied only when ashing is barely performed (STEP 2), and deposit gas is not supplied during ashing (STEP 1), so the ashing speed does not drop, and the drop in throughput can be minimized.

Second Embodiment

Figure 4:
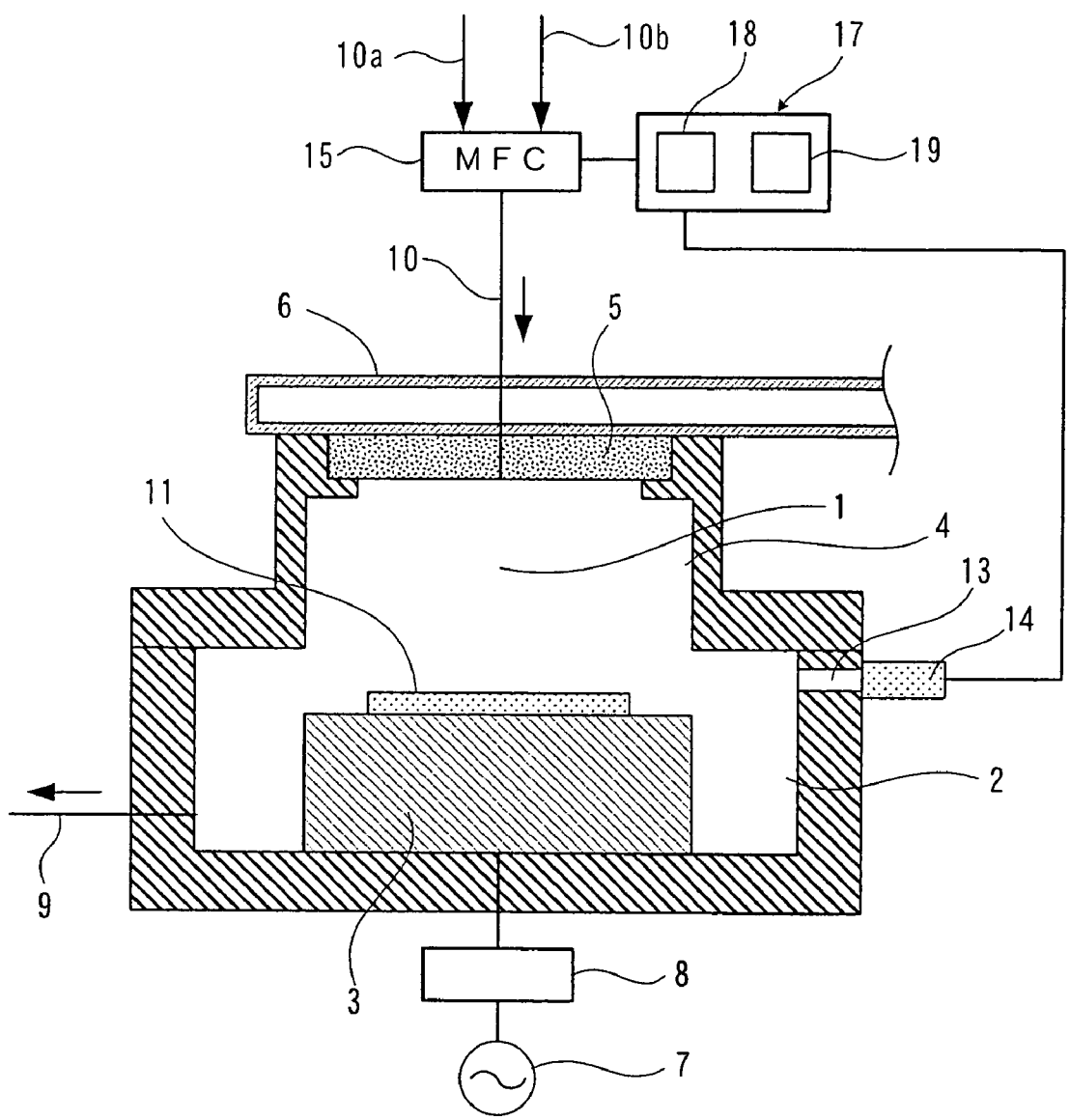
FIG. 4 is a cross-sectional view depicting a general configuration of the plasma processing device according to the second embodiment of the present invention.

FIG. 4 is a cross-sectional view depicting a general configuration of the plasma processing device according to the second embodiment of the present invention.

This plasma processing device comprises a wafer processing chamber 1 which is similar to the one described in the first embodiment. This plasma processing device further comprises a control device 17 which receives the output of the spectroscope 14 and controls the supply system 10. The control device 17 further comprises the gas addition amount computing device 18 for computing the addition amount of the deposit gas based on the detection result of the spectroscope 14, and the ashing amount computing device 19 for receiving the gas addition amount computing device 18 and computing the ashing amount.

By the above description, the emission intensity of the deposit component in the plasma is constantly monitored by the spectroscope 14, the addition amount of the deposit gas is computed by the gas addition amount computing device 18 which received the output of the spectroscope 14, so that a predetermined amount of deposit component can constantly exist in the plasma, and the computation result is output to the mass flow controller 15 and the ashing amount computing device 19.

More particularly, when the ashing process is started, the emission intensity of the deposit component (e.g. C) in the plasma is detected by the spectroscope 14, and the result is output to the gas addition amount computing device 18. In the gas addition amount computing device 18, the relational expression: $y=f1(x)$, where y is the addition gas flow rate and x is the emission intensity of the gas determined by a preliminary test, has been input in advance, and if the emission intensity x is detected as $x=a$, for example, the addition gas flow rate b is computed to be $b=f1(a)$, so that a predetermined amount of deposit component (the same component as the one for which the emission intensity was detected) will exist, and the computation result is output to the mass flow controller 15 as well as to the ashing amount computing device 19.

Figure 5A:
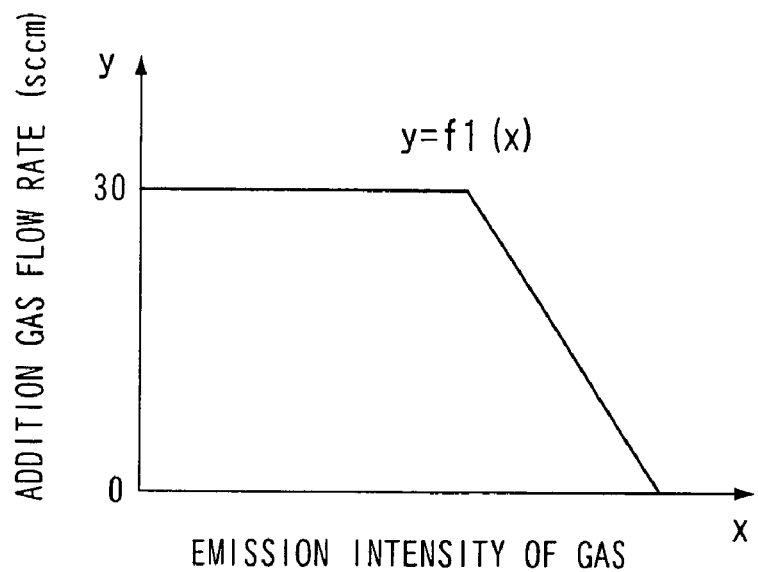
FIG. 5A is a graph depicting the relationship between the emission intensity of the deposit component of the gas in the plasma processing device in FIG. 4 and addition gas flow rate.

FIG. 5A is a graph depicting the relationship between the emission intensity x of the gas (deposit component) and addition gas flow rate y. Since the emission intensity x is in proportion to the deposit component amount, the addition gas flow rate y is increased in proportion to the decrease of emission intensity x in order to allow a predetermined amount of the deposit component in the plasma all the time, and also an upper limit is set for the addition gas flow rate y.

In the mass flow controller 15 which received the computation result of the gas addition amount computing device 18, the flow rate is controlled for the gas supply system for plasma generation 10a and deposit gas supply system 10b, so that the addition gas flow rate b becomes the computed result.

In the ashing amount computing device 19, the relational expression: $s=f2(y)$, where y is the addition gas flow rate and s is the ashing speed determined by a preliminary test, and the arithmetic expression: $c=\int f2(y)\Delta t$ for the ashing amount c for the time integral of the ashing speed s, have been input in advance, and the ashing speeds are computed based on the computation result of the gas addition amount computing device 18, and then the ashing amount c is computed.

Figure 5B:
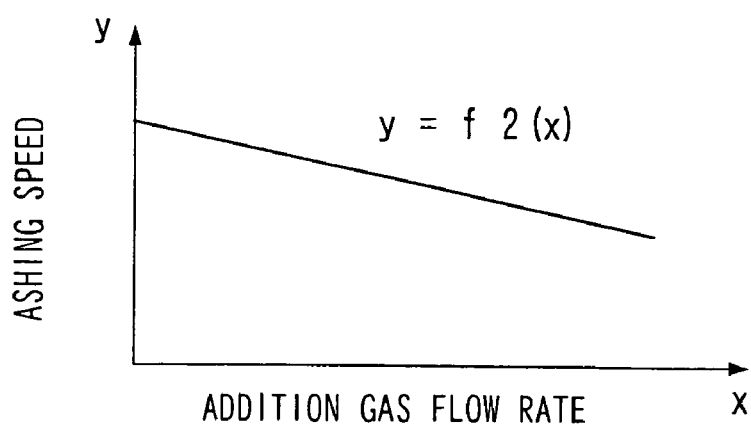
FIG. 5B is a graph depicting the relationship between the addition gas flow rate and ashing speed.

FIG. 5B is a graph depicting the relationship between the addition gas flow rate y and the ashing speed s, where the ashing speed s decreases in proportion to the increase of the addition gas flow rate y.

This series of operations is repeated for each $\Delta t$, and the total ashing amount $c(t+\Delta t)=c(t)+\int f2(x)\Delta t$ is computed. And at a point when the computation value of the ashing amount $c(t+\Delta t)$ exceeds the predetermined set value d, it is judged that ashing completed and ashing processing is stopped. The processing conditions are shown below.

microwave power: 2000 W
 RF power: 100 W
 $O_2$: 300 sccm
 CO: 0-30 sccm
 pressure: 30 Pa
 stage temperature: 30° C.

FIG. 6 is a graph depicting the relationship between the emission intensity of the gas and the addition gas flow rate under the above processing conditions. The addition gas flow rate increases in a 0-30 sccm range in proportion to the decrease of the emission intensity of the gas. 30 sccm is set as the maximum value of the addition gas flow rate, and a value exceeding 30 sccm is not used even if the emission intensity further decreases.

In this plasma processing method, the ratio of $O_2$ gas and deposit gas to be supplied into the wafer processing chamber 1 is always different. If the ratio of these gases change, it is difficult to estimate the ashing speed, so the ashing speed must be set higher. Therefore the ashing amount computing device 19 is used to prevent this. Simply by setting the ashing amount d in the ashing amount computing device 19 in advance, the ashing processing can be completed with the minimum necessary ashing time, and a drop in the throughput can be minimized.

In other words, according to the third plasma processing method, the gas addition amount computing device 18 receives the output of the spectroscope 14 and computes the gas addition flow amount so that the deposit component amount becomes constant, and the deposit gas is added based on the computation result, and also the ashing amount computation device 19 computes the ashing amount using this computation result, and ashing is completed at the point when the calculated ashing amount exceeds the set value, therefore while protecting the inner face of the wafer processing chamber 1, the ashing processing can be performed automatically with a minimum necessary ashing time, and a drop in the throughput can be minimized. It is unnecessary to set an ashing recipe for each process of the various steps and wafer processes, so the man-cost ratio can also be decreased.

FIG. 7 shows typical structures of ashing objects.

Figure 7A:
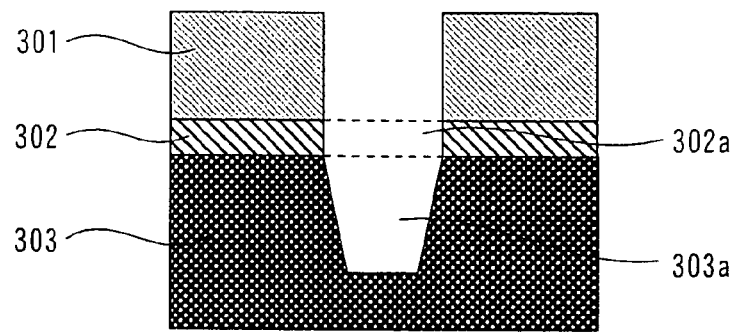
FIG. 7A, FIG. 7B and FIG. 7C are cross-sectional views depicting typical structures of an ashing target object respectively.

FIG. 7A shows an isolation pattern, where the resist 301 is formed on the oxide film 302 formed on the surface of the semiconductor substrate 303, and the openings 302a and 303a, which penetrate the oxide film 302 and reach the upper layer of the semiconductor substrate 303, are formed through the opening 301a of the resist 301.

Figure 7B:
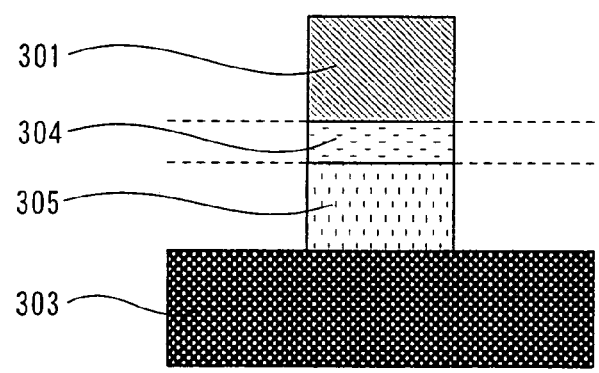

FIG. 7B shows the gate electrode, where a polysilicon film 305 and tungsten film 304 are layered on the semiconductor substrate 303 in this sequence, and the polysilicon film 305 and tungsten film 304 are patterned using the resist 301 formed thereon as a mask.

Figure 7C:
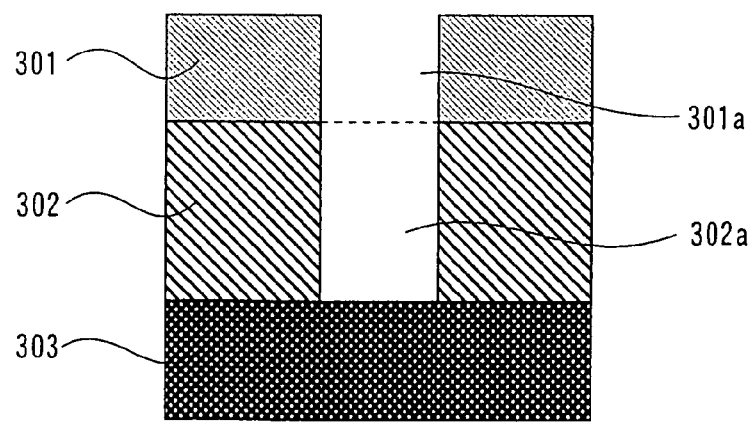

FIG. 7C shows a contact hole, where the resist 301 is formed on the oxide film 302 formed on the surface of the semiconductor substrate 303, and the opening 302a, corresponding to the opening 301a of this resist 301, is formed penetrating through the oxide film 302.

For these ashing objects with various structures, the amount of the deposit component, such as C, to be generated from the resist 301, which is the ashing target film, is different, but according to the third plasma processing method, the inner face of the wafer processing chamber 1 can be protected by adding an appropriate amount of the deposit gas automatically.

As described above, according to the plasma processing method and plasma processing device of the present invention, a deposit gas containing a deposit component is added to the gas for plasma generation, so the deposit component from the resist which decreases can be supplied by the deposit gas, and can still be deposited on the inner face of the wafer processing chamber, and the inner face of the wafer processing chamber can be protected from plasma. As a result, damage of the wafer processing chamber can be prevented and the generation of particles can be prevented.

In the above embodiments, an $O_2$ single gas was used as an example of the gas for plasma generation, but a mixed gas, such as $CF_4$ gas added to the $O_2$ gas, can also be used.

What is claimed is:

1. A plasma processing method for performing plasma ashing on a resist on a processing target substrate, comprising:

determining in advance a relationship between ashing speed and an addition amount of a deposit gas containing at least one type of deposit component to be generated from the resist by ashing; and adding the deposit gas to gas for plasma generation after the resist or the deposit component generated therefrom decreases to less than a predetermined amount, wherein the amount of the deposit gas added is changed to maintain the deposit component in the plasma at a predetermined amount;

monitoring the amount of deposit component by measuring emission intensity thereof; and determining the ashing speed from the addition amount of the deposit gas, calculating the ashing amount from the determined ashing speed and ashing time, and terminating ashing when the calculated ashing amount exceeds a set value.

2. The plasma processing method according to claim 1, wherein the deposit gas is a gas comprising at least one gas selected from the group consisting of CO, $CO_2$ and $CH_4$.

3. A plasma processing method for performing plasma ashing on a resist on a processing target substrate, comprising:

determining in advance a relationship between ashing speed and addition amount of a deposit gas containing at least one type of deposit component to be generated from the resist by ashing;

adding the deposit gas to gas for plasma generation after the resist or the deposit component generated therefrom decreases to less than a predetermined amount, wherein the amount of the deposit gas added is changed to maintain the deposit component in the plasma at a predetermined amount.

4. The plasma processing method according to claim 3, wherein the deposit gas is a gas comprising at least gas selected from the group consisting of CO, $CO_2$ and $CH_4$.

\* \* \* \* \*